United States Patent [19]
Landry

[11] Patent Number: 6,028,448
[45] Date of Patent: Feb. 22, 2000

[54] CIRCUITRY ARCHITECTURE AND METHOD FOR IMPROVING OUTPUT TRI-STATE TIME

[75] Inventor: Gregory J. Landry, San Jose, Calif.

[73] Assignee: Cypress Semiconductor Corp., San Jose, Calif.

[21] Appl. No.: 09/049,887

[22] Filed: Mar. 27, 1998

[51] Int. Cl.[7] .......................... H03K 19/00; H03K 19/02
[52] U.S. Cl. .............................................. 326/58; 327/374
[58] Field of Search ................................. 326/17, 56, 57, 326/58, 83, 86, 93, 95, 98, 121

[56] References Cited

U.S. PATENT DOCUMENTS 5,559,465  9/1996  Shah ........................................ 327/374

Primary Examiner—Michael Tokar
Assistant Examiner—Thanh-Tam Le
Attorney, Agent, or Firm—Young Law Firm, P.C.

[57] ABSTRACT

An output buffer includes a differential data circuit for generating a first and a second differential signal, a pulse circuit for generating a pulse signal, a first latch circuit set by the first differential signal and reset by either the pulse signal or the second differential signal and a second latch circuit set by the second differential signal and reset by either the pulse signal or the first differential signal. An output circuit generates an output signal, the output signal being tri-stated whenever the pulse signal resets the first and second latch circuits. A method for improving output tri-state time of an output buffer includes the steps of pre-charging first and the second differential data inputs; tri-stating the buffer output upon each assertion of a timing signal; switching the output out of tri-state and into either a first or a second logic state only when one of the first and second differential data inputs changes to an active state; and returning to the pre-charging step. As the output of the buffer is tri-stated upon each assertion of the timing signal irrespective of whether a current cycle is a read, write cycle or de-select cycle, the switching time from one device connected to a bus to another device connected to the same bus is decreased.

20 Claims, 4 Drawing Sheets

CIRCUITRY ARCHITECTURE AND METHOD FOR IMPROVING OUTPUT TRI-STATE TIME

BACKGROUND OF THE INVENTION

1. Field of the Invention

The invention pertains to the semiconductor field. More particularly, the present invention relates to output buffers for semiconductor devices, such as semiconductor memories.

2. Description of the Related Art

Two of the key specifications for synchronous static random access memories (SRAM) are the time from a clock pulse to a high impedance, or high-Z state (commonly referred to as the Tchz parameter), and the time from a clock pulse to a driven, or low-Z state (commonly referred to as the Tclz parameter). The ability to place outputs in a high-Z state is necessary to connect several devices (e.g. memory devices), or banks of such devices, to a common bus. For example, the outputs of a memory device should be tri-stated for a write or de-select cycle, but not for a read cycle. Moreover, in order to avoid bus contention issues during bank selection, it is important that the time from clock to high-Z be as short as possible. A short Tchz parameter allows the Tclz parameter to be shortened without causing bus contention. This results in higher performance for the system. Devices with short Tchz parameters may be electrically connected and disconnected from the bus rapidly and efficiently.

Traditionally, however, to determine whether to switch a bank or a device into a high impedance state or from a high impedance state to a driven state requires the combination of many control inputs. Indeed, whether to place the outputs of a device in a high-Z state or a driven state conventionally depends on whether the device or bank is currently selected or currently deselected, the state of a number of write control and read control signals, and the state of a plurality of other control signals. Thus, a complex combinatorial or other circuit is typically required to determine whether and when the outputs of a particular device are to be placed in a high-Z state, or are to be driven by the device.

For example, the mode of operation (e.g. read, write or de-select) of a memory device may be a function of a plurality of chip enable input signals, a plurality of write enable input signals, and a plurality of address strobe input signals. A significant component of the Tchz and Tclz times are a result of the combinatorial logic used to determine whether or not the outputs should be tri-stated for the current cycle. Thus, Tchz and Tclz are typically related to the sum of the propagation delays of the respective logic gates used to determine whether the outputs should be tri-stated.

This delay in determining whether outputs of memory devices should be tri-stated is a significant factor in the performance of such devices. Indeed, the ability to rapidly switch between a plurality of devices attached to a common bus directly affects the speed at which data may be accessed and transferred over the common bus. For example, to switch from a first device to a second device connected to a common bus, the outputs of the first device must first be placed in a high impedance state before the second device may be selected and taken out of tri-state. Improper timing may cause the outputs of both devices to be active at the same time, resulting in bus contention issues and abnormally large current flowing through the bus structure. Alternatively, a slow clock to low impedance parameter Tclz will delay the second device from switching out of the high impedance state, thus reducing the overall performance of the memory device.

There has been a long felt need, therefore, for means and a method that would allow rapid switching between outputs of devices connected to a common bus structure. This would be possible if the outputs of, e.g. memory devices, could be quickly placed in and taken out of a high impedance state. What is also needed, therefore, are a means and a method for quickly tri-stating outputs of semiconductor devices. Furthermore, means and methods are needed that reduce the time necessary to switch into and out of tri-state. Such means and methods should not, however, adversely affect the functionality and performance (e.g. access time) of the device(s) in question.

SUMMARY OF THE INVENTION

It is, therefore, an object of the present invention to provide an architecture, a circuit and a method for rapidly switching between outputs of devices connected to a bus structure. It is also an object of the present invention to provide an output buffer and methods for quickly tri-stating outputs of semiconductor devices.

In accordance with the above objects and those that will be mentioned and will become apparent below, the output buffer according to an embodiment of the present invention comprises a differential data circuit for generating a first and a second differential signal; a pulse circuit for generating a pulse signal; a first latch circuit set by the first differential signal and reset by either the pulse signal or the second differential signal; a second latch circuit set by the second differential signal and reset by either the pulse signal or the first differential signal; and an output circuit for generating an output signal, the output signal being tri-stated whenever the pulse signal resets the first and second latch circuits.

According to other embodiments, the output buffer may further include a first reset circuit configured to reset the first latch circuit responsive to either the pulse signal or the second differential signal. The first reset circuit may include a first switching circuit controlled by the pulse signal and a second switching circuit controlled by the second differential signal. The output buffer may also comprise a second reset circuit configured to reset the second latch circuit responsive to either the pulse signal or the first differential signal. The second reset circuit may comprise a third switching circuit controlled by the pulse signal and a fourth switching circuit controlled by the first differential signal. The output buffer may also include a first set circuit configured to set the first latch circuit responsive to the first differential signal and a second set circuit configured to set the second latch circuit responsive to the second differential signal. One or both of the first and second latch circuits may comprise crosscoupled inverter circuits. The pulse circuit may be configured to generate a pulse signal having a width sufficient to reset the first and second latch circuits. The pulse circuit may comprise a number of series connected delay elements, this number of delay elements corresponding to the pulse width necessary to reset the first and second latch circuits. The output circuit may be configured to receive an output signal of the first latch circuit and an output signal of the second latch circuit and to selectively output the first differential signal, the second differential signal or the tri-stated output buffer signal. The output circuit may be configured to invert the first and second latch circuit output signals and to feed the inverted first and second latch circuit signals to respective control inputs of a pull up device and a series-connected pull down device, the buffer output signal being taken between the pull up and pull down devices. The pull up device may include a PMOS device and the pull down device may include an NMOS device. The pull up device may comprise an NMOS device, and the inverted first latch circuit output signal may be inverted again and fed to a control input of the NMOS device.

According to another illustrative embodiment, the method for improving output tri-state time of an output buffer having a first and a second differential data input comprises, according to the present invention, the sequential steps of pre-charging the first and the second differential data inputs to the buffer; tri-stating an output of the buffer upon each assertion of a timing signal; switching an output of the buffer out of tri-state and into either a first or a second logic state only when either one of the first and second differential data inputs changes to an active state; and returning to the pre-charging step.

The timing signal may be a clock signal when the output buffer is utilized in conjunction with a synchronous device or an address transition detection signal when the output buffer is utilized with an asynchronous device having address transition detection. When the buffer is utilized with a synchronous device, the output of the buffer may be tri-stated on the rising edge of each clock signal. The output of the buffer may be tri-stated after the rising edge of each clock signal between the end of the period during which previous data must remain valid and the beginning of the period during which new data is to be available.

According to a still further embodiment of the present invention, a method of improving switching times between a first and a second device connected to a common bus comprises the sequential steps of tri-stating a selected first or second device upon each assertion of a timing signal; switching the selected device out of tri-state and into a first or a second logic state only after new data is available to the selected device and a read cycle is initiated; and returning to the tri-stating step. In this manner, when the currently selected device is deselected and the other one of the first and second devices is newly selected, the deselected device is already tri-stated, thereby allowing the newly selected device rapid access to the bus.

The tri-stating step may tri-state the selected one of the first and second devices upon a rising edge of each clock signal for synchronous devices and upon each assertion of a signal indicative of an address transition detection for asynchronous devices utilizing address transition detection.

BRIEF DESCRIPTION OF THE DRAWINGS

For a further understanding of the objects and advantages of the present invention reference should be made to the following detailed description, taken in conjunction with the accompanying figures, in which.

DESCRIPTION OF THE PREFERRED EMBODIMENTS

Figure 1:
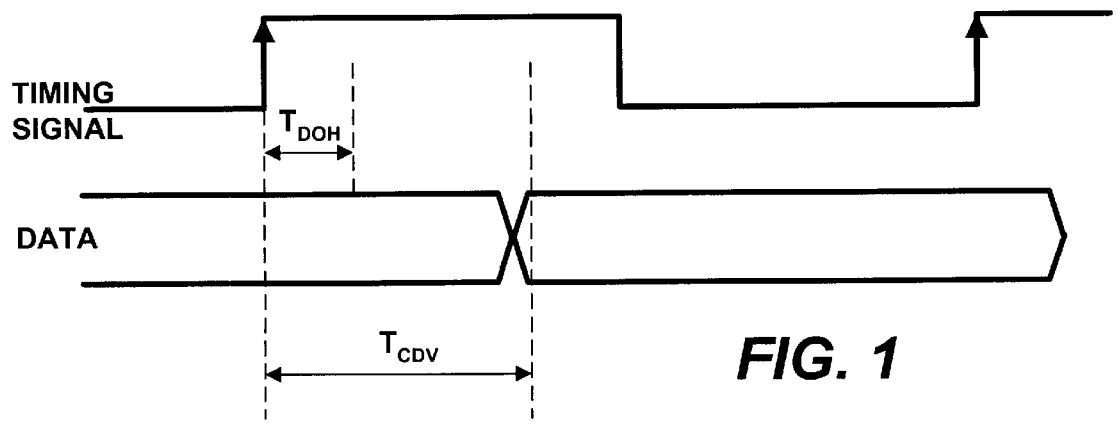
FIG. 1 is a diagram illustrating some timing parameters of a switching digital signal.

FIG. 1 illustrates two timing parameters or switching characteristics useful in describing the behavior of a data signal switching between a current logic state and a next logic state. For example, the new data signal DATA illustrated in FIG. 1 is guaranteed to be valid after a time period Tcdv after the rising edge of the timing signal, such as a clock signal. In contrast, the parameter Tdoh is the minimum period of time during which the current data signal must remain valid prior to switching. Of course, these parameters may be referenced by labels other than Tcdv or Tdoh, depending upon the application. Traditionally, as shown in FIG. 1, the current data signal remains in its current logic beyond the minimum required Tdoh, switching to the next logic state only immediately prior to the end of the Tcdv period.

According to the present invention, however, the data signal is rapidly tri-stated (switched to a high-Z state) on each rising clock edge, during a time period between the end of the period during which the current data must remain valid and the beginning of the period after which the new data must be valid. In other words, according to one embodiment of the present invention, the data signal is put in a high-Z state on every clock edge during at least some portion of the interval between the Tdoh and the Tcdv periods. Prior to discussing the advantages of such a switching scheme, an embodiment of the present invention is described with reference to FIGS. 2a and 2b.

Figure 2A:
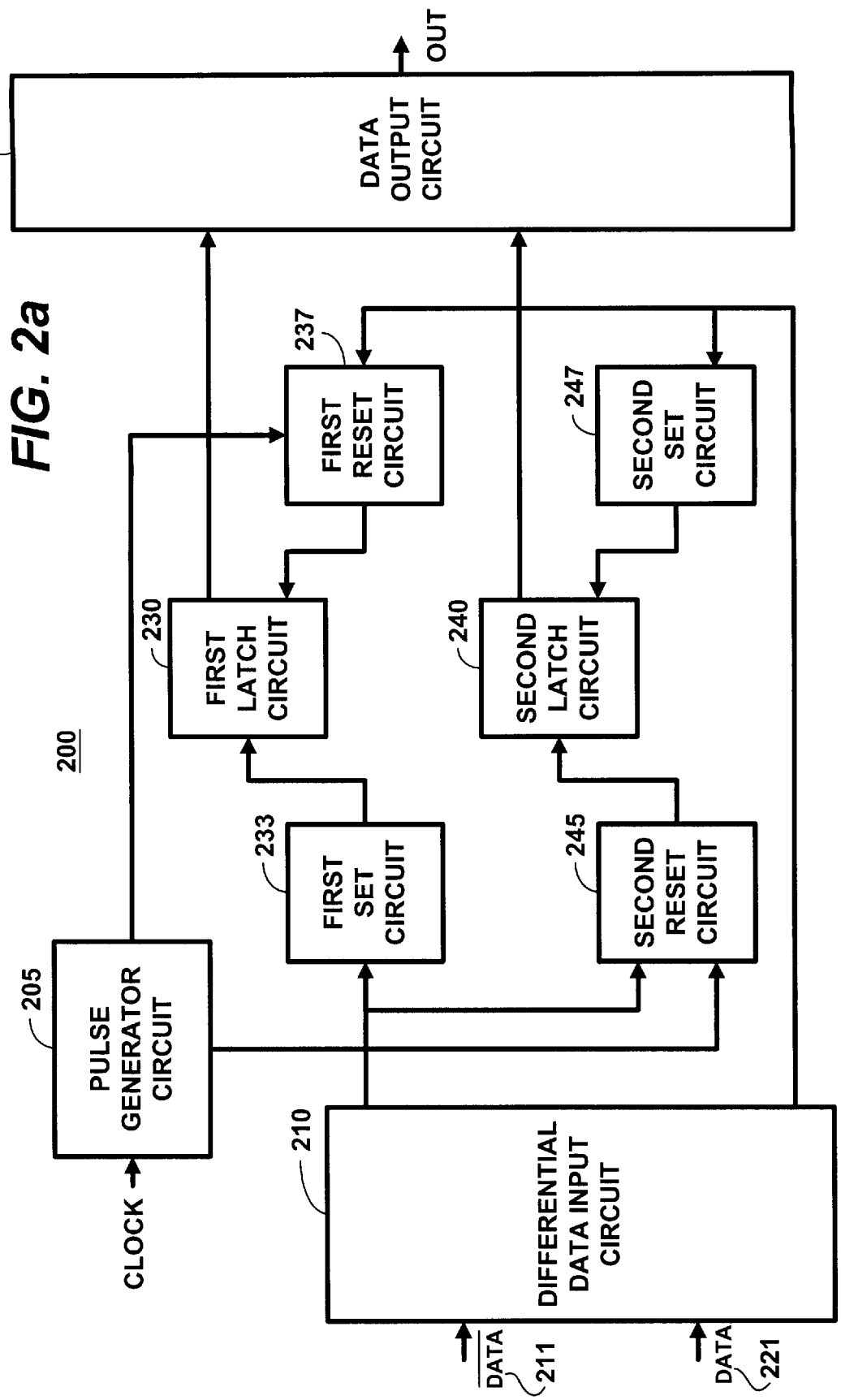
FIG. 2a is a functional block diagram of an output buffer according to an embodiment of the present invention.
Figure 2B:
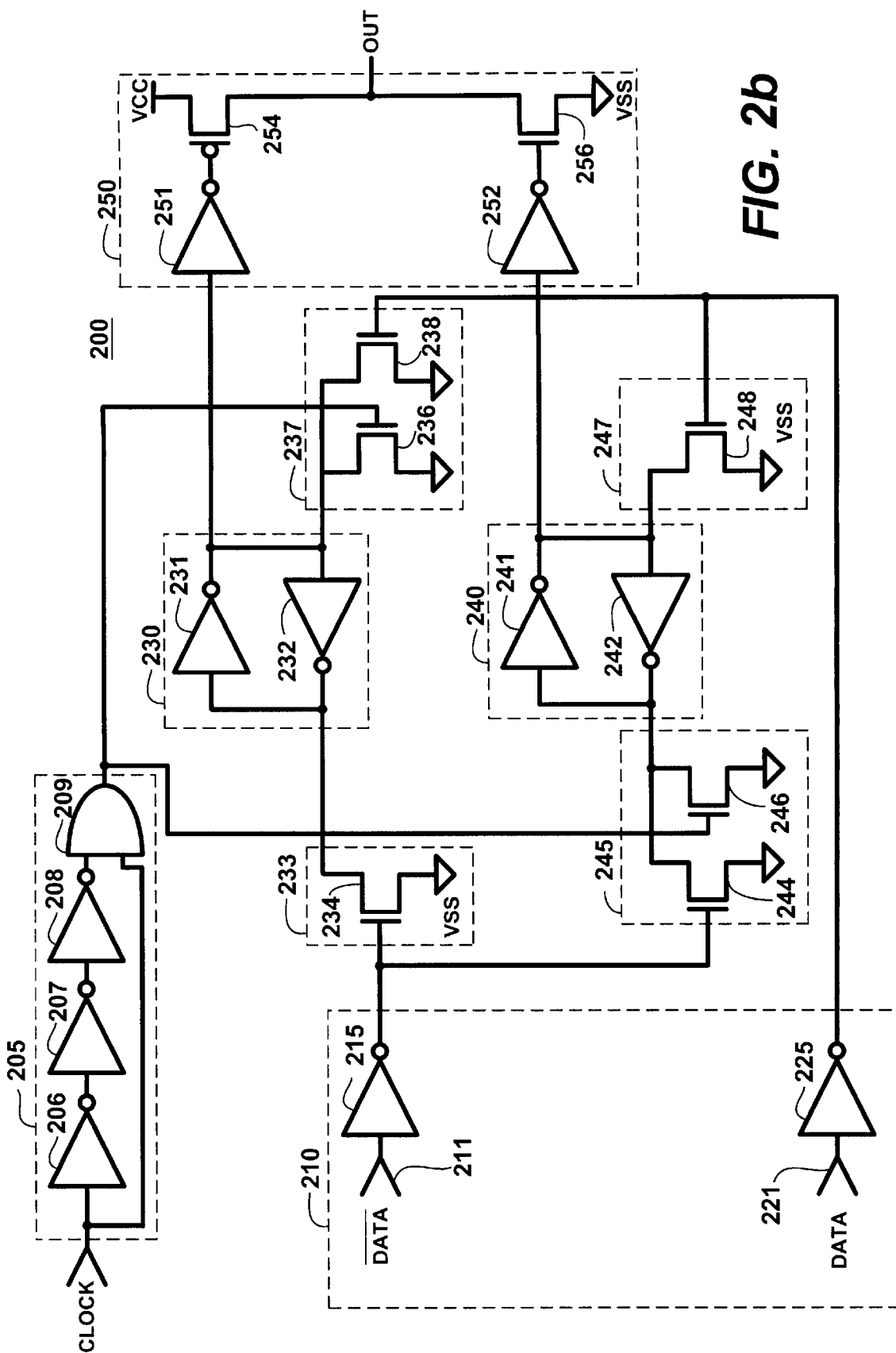
FIG. 2b is a circuit diagram of an output buffer according to an embodiment of the present invention.

FIG. 2a shows a functional block diagram of an embodiment of the present invention. FIG. 2b is an implementation, in circuit diagram form, of the present invention shown in FIG. 2a. FIG. 2a shows an output buffer 200 including a differential data input circuit 210, a data output circuit 250, a pulse generator circuit 205, first and second latch circuits 230, 240, first and second set circuits 233, 247 and first and second reset circuits 237, 245. The input signals to the differential data input circuit 210 are the differential data signals DATA 221 and $\overline{\text{DATA}}$ 211. For example, the DATA signal 221 may be asserted when the data signal switches to a first logic level, such as a logical one, whereas the $\overline{\text{DATA}}$ signal 211 may be asserted when the data signal switches to a second logic level, such as a logical zero. They are not, however, always complements of one another.

The differential data input circuit 210, in the implementation of the invention shown in FIG. 2b, takes the $\overline{\text{DATA}}$ signal 211 and inverts it by means, for example, of an inverter 215, which outputs an inverted $\overline{\text{DATA}}$ signal 211. Likewise, the differential data input circuit 210 takes the DATA signal 221 and inverts it by means of, for example, an inverter 225, which and outputs an inverted DATA signal.

The inverted $\overline{\text{DATA}}$ signal is connected to and controls the first set circuit 233. In the embodiment shown in FIG. 2b, the inverted $\overline{\text{DATA}}$ signal is connected to the control terminal of a switching device, such as switching device 234. Switching device 234 may be, as shown in FIG. 2b, an n-channel transistor, and the inverted $\overline{\text{DATA}}$ signal may be connected to the gate terminal thereof. Likewise, the inverted DATA signal is connected to and controls the second set circuit 247. In the embodiment shown in FIG. 2b, the inverted DATA signal is connected to the control terminal of a switching device, such as switching device 248. Switching device 248 may be, as shown in FIG. 2b, an n-channel transistor, and the inverted DATA signal may be connected to the gate terminal thereof. The source terminals of transistors 234 and 248 may be connected to a reference voltage Vss, such as ground.

The first set circuit 233 is connected to the first latch circuit 230. For example, the drain terminal of the transistor device 234 may be connected, as shown in FIG. 2b, to the first latch circuit 230. Likewise, the second set circuit 247 is connected to the second latch circuit 240. For example, the drain terminal of the transistor device 248 may be connected, as shown in FIG. 2b, to the second latch circuit 240. The first and second latch circuits 230, 240 may be implemented as cross-connected parallel inverters, as shown in the embodiment of the present invention illustrated in FIG. 2b. The first latch circuit 230 may include an inverter 231 and an inverter 232, each having an input and an output. In the first latch circuit 230, the output of inverter 231 is connected to the input of inverter 232, and the output of inverter 232 is connected to the input of inverter 231. Likewise, the second latch circuit 240 may include an inverter 241 and an inverter 242, each having an input and an output. The output of inverter 241 is connected to the input of inverter 242, and the output of inverter 242 is connected to the input of inverter 241. The present invention is not, however, to be limited to the implementations of the latch circuits 230, 240 shown in FIG. 2b. Indeed, those of skill in this art will recognize that the cross-connected inverters are but one of many possible configurations for the first and second latch circuits 230, 240 and all such configurations are deemed to fall within the scope of the present invention. For example, the first and second latch circuits 230, 240 may include flip-flops, or may be implemented with NAND or NOR logic.

Also connected to the first latch circuit 230 is a first reset circuit 237. In the embodiment of the present invention shown in FIG. 2b, the first reset circuit 237 is connected to the input of the inverter 232. The first reset circuit 237 is controlled by the output of the pulse generator circuit 205 and by the inverted DATA signal output from the differential data input circuit 210. In one embodiment of the present invention, the first reset circuit 237 includes two switching devices, one controlled by the pulse generator circuit 205 and the other controlled by the inverted DATA signal from the differential data input circuit 210. Indeed, the first reset circuit 237 may include a transistor 236 controlled by the pulse generator circuit 205 and a transistor 238 controlled by the inverted DATA signal from the differential data input circuit 210. The transistors 236 and 238 may be n-channel MOS transistors whose gate terminals are connected to the pulse generator circuit 205 and the inverted DATA signal from the differential data input circuit 210, respectively. The sources of transistors 236 and 238 may be connected to a reference voltage Vss, such as ground. The drain terminals of the transistors 238, 236 are each connected, in the embodiment shown in FIG. 2b, to the input of the inverter 232 and to the output of the inverter 231 of the first latch circuit 230. Other implementations of the first reset circuit are possible, as will naturally occur to those of skill in this art.

Connected to the second latch circuit 240 is a second reset circuit 245. In the embodiment of the present invention shown in FIG. 2b, the second reset circuit 245 is connected to the output of inverter 242. The second reset circuit 245 is controlled by the output of the pulse generator circuit 205 and by the inverted $\overline{DATA}$ signal output from the differential data input circuit 210. In one embodiment of the present invention, the second reset circuit 245 includes two switching devices, one controlled by the pulse generator circuit 205 and the other controlled by the inverted $\overline{DATA}$ signal from the differential data input circuit 210. Indeed, the second reset circuit 245 may include a transistor 246 controlled by the pulse generator circuit 205 and a transistor 244 controlled by the inverted $\overline{DATA}$ signal from the differential data input circuit 210. The transistors 246 and 244 may be n-channel MOS transistors whose gate terminals are connected, respectively, to the pulse generator circuit 205 and to the inverted $\overline{DATA}$ signal from the differential data input circuit 210. The sources of transistors 246 and 244 may be connected to a reference voltage Vss, such as ground. The drain terminals of the transistors 244, 246 are each connected, in the embodiment shown in FIG. 2b, to the input of the inverter 241 and to the output of inverter 242 of the second latch circuit 240. Other circuit configurations are possible for the second reset circuit, as those of skill in this art will recognize.

The pulse generator circuit 205 generates a pulse that is used to control the first and second reset circuits 237 and 245, respectively. More particularly, the output of the pulse generator circuit 205 may be connected to the gate terminals of n-channel transistors 236 and 246. The width of the pulse output from the pulse generator circuit 205 is chosen to be sufficient to reset both the first and second latch circuits 230, 240 on every clock pulse. This is done by pulling the input of inverter 232 and the output of inverter 231 to Vss or ground, as well as by pulling the output of inverter 242 and the input of inverter 241 to Vss or ground. Although many different architectures for pulse generator circuits will occur to those of skill in this art, the embodiment thereof shown in FIG. 2b utilizes series connected delay elements, such as inverters 206, 207 and 208 to create a pulse having an approximate width (duration) of about three inverter delays. As shown in FIG. 2b, a clock signal, or other timing signal, is fed to the input of the first inverter 206, as well as to the logical AND gate 209. The other input to the AND gate 209 is the output of the last inverter 208. The output of the AND gate 209 is connected to the gate terminals of transistors 236 and 246 of the first and second reset circuits 237, 245, respectively. Although three inverters 206, 207 and 208 are shown in FIG. 2b, the present invention is not to be limited thereto. Indeed, the number of such inverters, as well as the configuration of the pulse generator circuit 205 itself may be freely chosen, consistent with the need to insure that the first and second latch circuits 230, 240 are fully reset by the pulse signal.

The outputs of the first and second latch circuits 230, 240 are connected to the data output circuit 250. The data output circuit 250 may include inverters 251 and 252. The inverters 251 and 252 may be connected, respectively, to the outputs of the first and second latch circuits 230 and 240. Indeed, in the illustrated embodiment, the input of the inverter 251 may be connected to the node connecting the output of the inverter 231 with the input of the inverter 232. Likewise, the input of the inverter 252 may be connected to the node connecting the output of the inverter 241 with the input of the inverter 242. The data output circuit 250 may also include a pull-up switching device connected to and controlled by the output of the inverter 251 and a pull-down switching device connected to and controlled by the output of the inverter 252. For example, the pull-up switching device may be a p-channel transistor 254 whose gate terminal is connected to the output of the inverter 25 1, and the pull-down transistor may be an n-channel transistor 256 whose gate electrode is connected to the output of the inverter 252. The source terminal of p-channel transistor 254 may be connected to Vcc, which may be connected to, for example, a 5 V or 3.3 V supply. The pull-up transistor need not necessarily be a p-channel transistor. Indeed, an n-channel device may be used as the pull-up device, provided another inverter is placed in series with inverter 251 and connected with the gate of this n-channel device. The source terminal of n-channel transistor 256 may be connected to a reference voltage Vss, such as ground. The drains of the p-channel transistor 254 and n-channel transistor 256 are connected together, and form the node from which the output of the output buffer circuit 200 is taken. The transistors may be metal-oxide semiconductor (MOS) transistors, or most any appropriate technology, as those of skill will recognize.

The operation of the output buffer according to the present invention will now be described, with reference to FIG. 2b. For convenience, the following description will arbitrarily assume that the initial output of the data output circuit 250 is a 1, or high. Therefore, transistor (hereafter Tr) 254 is ON (in a conducting state), the output of inverter 231 is 1, Tr256 is OFF (in a non-conducting state), and the output of inverter 241 is 1. After the rising edge of the CLOCK signal, the pulse generator circuit 205 generates a pulse of a predetermined duration that is set, in the example of FIG. 2b, by the number of seriesconnected inverters. The pulse generated by the pulse generator circuit 205 turns Tr236 and Tr246 ON, thus pulling the input of inverter 241 down to Vss. However, as the output of inverter 241 is 1, its input is already low. The second reset circuit 245, therefore, merely clamps the input of inverter 241 to Vss. However, in the case of the first latch circuit 230, the output of the inverter 231 was 1 prior to the arrival of the pulse from the pulse generator circuit 205. Tr236, now conducting, pulls the output of inverter 231 and the input of inverter 232 low, thereby also pulling the input to inverter 251 low and turning Tr254 OFF. Under these conditions, both Tr254 and Tr256 are OFF and the output OUT of the buffer 200 is tri-stated (in a high-impedance state).

After the pulse generated by the pulse generator circuit 205 is gone, the first and second latch circuits 230, 240 keep their current values until either of the DATA or $\overline{\text{DATA}}$ signals are asserted. The DATA and $\overline{\text{DATA}}$ inputs are, according to the present invention, initially pre-charged to a high value on each cycle. Indeed, if the DATA and $\overline{\text{DATA}}$ signals were not pre-charged, they would be driving one or both of the first and second latch circuits 230 and 240, and the latches could not be reset by the pulse generated by the pulse generator circuit 205. Pre-charging the DATA and $\overline{\text{DATA}}$ signals to a high level causes inverters 215 and 225 to output a logical 0 and causes Tr234, Tr248, Tr244 and Tr238 to turn OFF. At this point in time the DATA and $\overline{\text{DATA}}$ signals are not affecting the values stored in the first and second latch circuits 230 and 240.

At the beginning of each cycle, the CLOCK input causes the pulse generator circuit 205 to output a pulse that resets the outputs of the first and second latch circuits 230 and 240. During a WRITE cycle or a de-select cycle, the $\overline{\text{DATA}}$ and DATA signals do not change and the output OUT remains tri-stated. During a READ cycle, however, either a one or a zero value is available on the DATA or $\overline{\text{DATA}}$ signals, depending upon which is asserted. Indeed, if the $\overline{\text{DATA}}$ signal is asserted (pulled low), the DATA signal will remain de-asserted, or high. In that case, Tr234 will turn ON, setting the first latch circuit 230 and Tr244 will also turn ON, resetting the second latch circuit 240, which remains in the same state that it was previously in. The setting of the first latch circuit 230 causes its output to go high, and the output OUT of the buffer 200 will go from tri-state to a high or 1 value. In this case, the output OUT transitioned from driving a high, or 1 value, to tri-state, and back to driving a high, or 1 value. If, on the other hand, the DATA signal is asserted and pulled low, Tr238 is turned ON to reset the first latch circuit 230. An asserted DATA signals also turns Tr248 ON, setting the second latch circuit 240 and causing Tr256 to conduct, causing the output buffer output OUT to switch to a low value.

Thereafter, DATA and $\overline{\text{DATA}}$ are again pre-charged, in preparation for the next cycle. A cycle is defined by the following consecutive events: a pre-charging of the DATA and $\overline{\text{DATA}}$ signals, a pulse from the pulse generator circuit 205 to reset the first and second latch circuits 230 and 240 followed by, after the pulse is gone, an assertion of either the DATA or $\overline{\text{DATA}}$ signals to set the output OUT to the appropriate logical value. Care must be taken to prevent the assertion of the DATA and $\overline{\text{DATA}}$ signals before the end of the pulse from the pulse generator circuit 205. Failure to do so would cause, for example, the first reset circuit 237 and the first set circuit 233 to attempt to pull the first latch circuit 230 in opposite directions.

In conventional output buffers, a control signal is timed to release the output from tri-state when data is available. However, the timing of the control signal is complex and may release the output out of tri-state too early, before data is available. In that case, there is the danger that two or more devices may contend for the bus at the same time. Alternatively, the output OUT may, in conventional output buffers, be released too late; meaning after the data has been available. In that case, the access time suffers. One advantage of the present invention, on the other hand, is that the output OUT of the output buffer 200 is tri-stated very quickly during each clock cycle, the output OUT remaining in tri-state until data is available on either of the differential data lines $\overline{\text{DATA}}$ and DATA.

Figure 3:
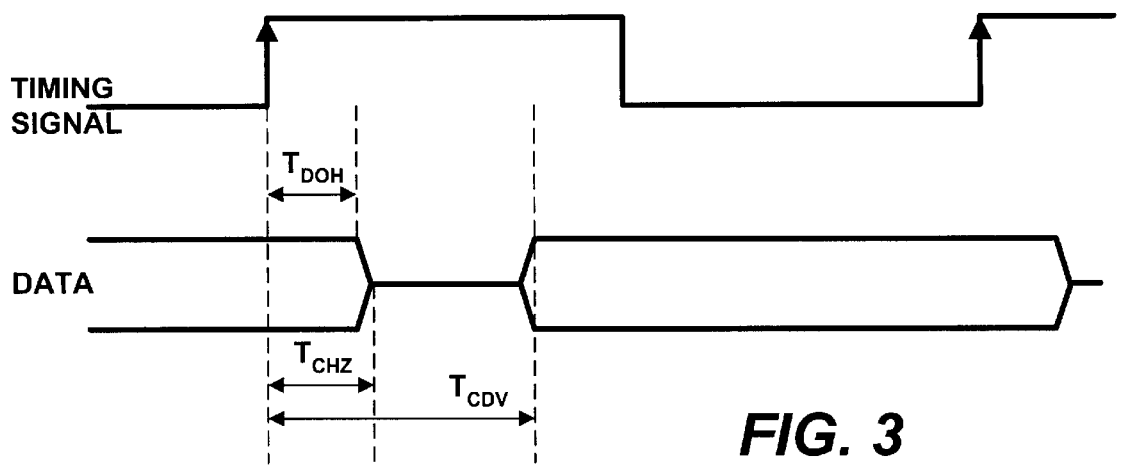
FIG. 3 is a diagram illustrating the operation of the output buffer according to an embodiment of the present invention.

Reference is now made to FIG. 3. As shown therein, during a READ cycle, for example, upon the rising edge of the timing signal, such as the CLOCK signal of FIGS. 2a and 2b, the current data remains valid at the output OUT of the buffer for a period Tdoh. The first and second latch circuits 230, 240 are then reset by the first and second reset circuits 237, 245, respectively. The output OUT is tri-stated rapidly after the Tdoh period, as shown by Tchz in FIG. 3. The output OUT remains tri-stated until the next data is valid, at the end of the Tcdv period.

Figure 4:
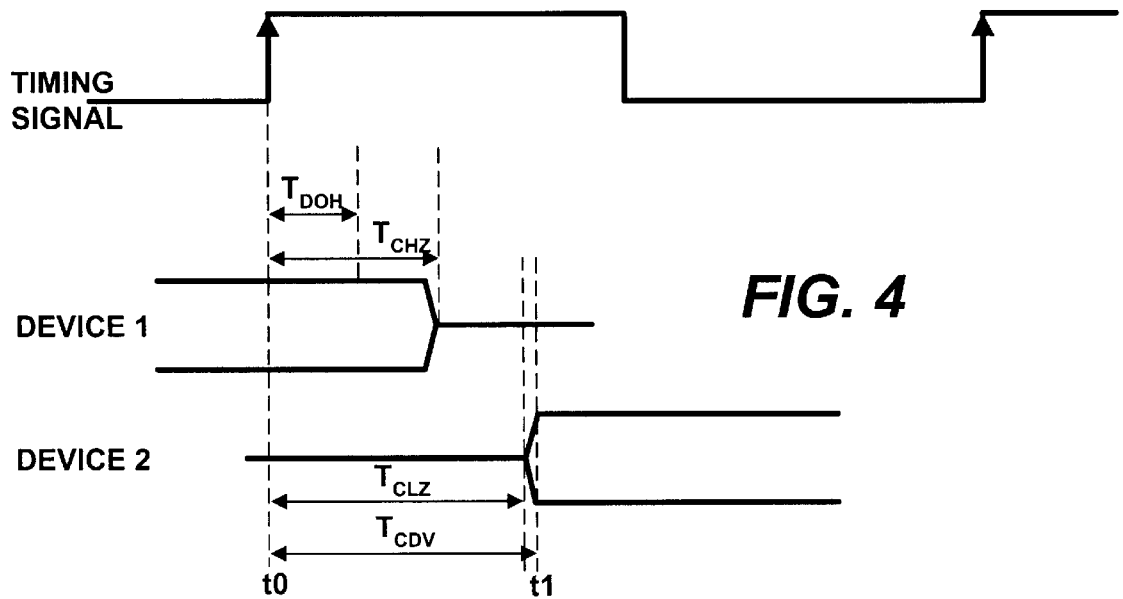
FIG. 4 is a diagram illustrating switching between two devices attached to a common bus.
Figure 5:
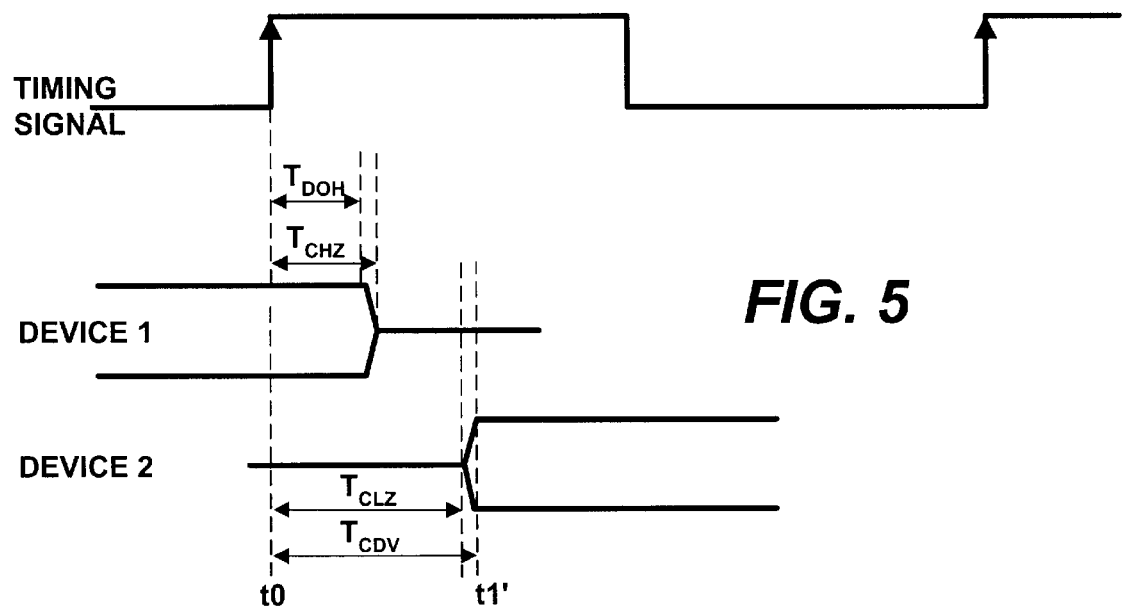
FIG. 5 is a diagram illustrating switching between two devices attached to a common bus, according to an embodiment of the present invention.

The advantages of the present invention are most apparent when switching from one device connected to a bus to another device connected to the same bus. Conventionally, as shown in FIG. 4, upon the rising edge of a timing signal, such as a clock signal, when a device, such as DEVICE 1 was de-selected, a number of signals were combined in a complex combinatorial circuit to produce the necessary control signal to tri-state DEVICE 1's output. Since the time for this was directly related to the complexity of the combinatorial circuit, the time Tchz from clock rising edge to high-Z was quite longer than the Tdoh period, as shown in FIG. 4. Only when the output of DEVICE 1 is tri-stated at the end of the long Tchz period may DEVICE 2 be selected, at time t. In contrast, according to the present invention, as shown in FIG. 5, by quickly tri-stating the output OUT of FIG. 2 upon each timing signal rising edge, the time from rising clock edge to high-Z Tchz is only slightly longer than the Tdoh period itself, during which the current data must remain valid after the clock pulse rising edge. As DEVICE 1 is tri-stated that much sooner, DEVICE 2 may be selected and electrically connected to the bus sooner than was conventionally possible. Indeed, the period from t0 to t1 in FIG. 4 is greater than the period from to to t1', as the time to high-Z, according to the present invention has been greatly reduced, without resorting to the complex combinatorial circuits that were previously necessary.

The circuit and method according to the present invention allows the output of the output buffer to tri-state quickly without the need to determine the state of control inputs, thereby improving Tchz, the clock to high-Z performance. According to the present invention, the timing signal (such as the clock signal) is sent directly to the output buffer so that each rising clock edge causes the output to tri-state quickly. If the current cycle is a WRITE cycle or a device de-select, the output OUT remains in tri-state. However, if the current cycle is a READ cycle, the output comes out of tri-state as soon as new data is available to the output buffer, at the differential data input circuit 210. For READ cycles, therefore, the output goes from valid data from the previous cycle, to tri-state, to valid data for the current cycle. The output OUT automatically remains in tri-state until valid data is available for the current cycle. This allows the maximum of time between Tchz and Tclz (time from clock to output active) without slowing down access time. According to the present invention, the data inputs are differential signals that are pre-charged during the inactive portion of the cycle, the portion where no valid data is available. This allows the output buffer to be reset until new data arrives at $\overline{DATA}$ and DATA, the data inputs of the output buffer according to the present invention. Tri-stating the output OUT quickly helps to prevent bus contention when selection is done between more than one device on a data bus. Since the output of the buffer remains tri-stated until valid data is available for the current cycle, the time between the output going into and coming out of tri-state is maximized without adversely affecting the access time of the chip.

According to the present invention, the clock signal is brought directly to the output buffer, as shown in FIG. 2. However, the present invention may also be advantageously applied to an asynchronous device having address transition detection (ATD). In this case, the ATD clock pulse is used to tri-state the output.

While the foregoing detailed description has described preferred embodiments of the present invention, it is to be understood that the above description is illustrative only and not limiting of the disclosed invention. For example, other implementations of the functional blocks shown in FIG. 2a are possible. Further modifications will occur to those of skill in this art, and all such modifications are deemed to fall within the scope of the present invention. Thus, the present invention is to be limited only by the claims as set forth below.

What is claimed is:

1. An output buffer, comprising:
   a differential data circuit for generating a first and a second differential signal;
   a pulse circuit for generating a pulse signal;
   a first latch circuit set by the first differential signal and reset by one of said pulse signal and said second differential signal;
   a second latch circuit set by the second differential signal and reset by one of said pulse signal and said first differential signal; and
   an output circuit for generating a buffer output signal, said output buffer signal being tri-stated whenever said pulse signal resets said first and second latch circuits.

2. The output buffer of claim 1, further comprising a first reset circuit configured to reset the first latch circuit responsive to one of said pulse signal and said second differential signal.

3. The output buffer of claim 2, wherein said first reset circuit comprises a first switching circuit controlled by said pulse signal and a second switching circuit controlled by said second differential signal.

4. The output buffer of claim 1, further comprising a second reset circuit configured to reset the second latch circuit responsive to one of said pulse signal and said first differential signal.

5. The output buffer of claim 4, wherein said second reset circuit comprises a third switching circuit controlled by said pulse signal and a fourth switching circuit controlled by said first differential signal.

6. The output buffer according to claim 1, further comprising a first set circuit configured to set said first latch circuit responsive to said first differential signal.

7. The output buffer according to claim 1, further comprising a second set circuit configured to set said second latch circuit responsive to said second differential signal.

8. The output buffer of claim 1, wherein at least one of said first and second latch circuits comprises cross-coupled inverter circuits.

9. The output buffer of claim 1, wherein said pulse circuit is configured to generate a pulse signal having a width sufficient to reset said first and second latch circuits.

10. The output buffer of claim 9, wherein said pulse circuit comprises a number of series connected delay elements, said number corresponding to the pulse width necessary to reset said first and second latch circuits.

11. The output buffer of claim 1, wherein the output circuit is configured to receive an output signal of said first latch circuit and an output signal of said second latch circuit and to selectively output one of said first differential signal, said second differential signal and said tri-stated output buffer signal.

12. The output buffer of claim 11, wherein said output circuit is configured to invert said first and second latch circuit output signals and to feed said inverted first and second latch circuit output signals to respective control inputs of a pull up device and a series-connected pull down device, said buffer output signal being taken between said pull up and pull down devices.

13. The output buffer of claim 12, wherein the pull up device includes a PMOS device and the pull down device includes an NMOS device.

14. The output buffer of claim 12, wherein the pull up device comprises an NMOS device, and wherein said inverted first latch circuit output signal is again inverted and fed to a control input of the NMOS device.

15. A method for improving output tri-state time of an output buffer having a first and a second differential data input, comprising the sequential steps of:
   pre-charging the first and the second differential data inputs to the buffer;
   tri-stating an output of the buffer upon each assertion of a timing signal;
   switching an output of the buffer out of tn-state and into one of a first and a second logic state only when one of the first and second differential data inputs changes to an active state; and
   returning to said pre-charging step.

16. The method of claim 15, wherein the timing signal is a clock signal when the output buffer is utilized with a synchronous device and an address transition detection signal when the output buffer is utilized with an asynchronous device having address transition detection.

17. The method of claim 16, wherein, when the buffer is utilized with a synchronous device, the output of the buffer is tri-stated on a rising edge of each clock signal.

18. The method of claim 17, wherein the output of the buffer is tri-stated after the rising edge of each clock signal during at least a portion of an interval between an end of a period during which previous data must remain valid and a beginning of a period during which new data must be available.

19. A method of improving switching times between a first and a second device connected to a common bus, comprising the sequential steps of:

tri-stating a selected one of the first and second devices upon each assertion of a timing signal;

switching the selected device out of tri-state and into a first or a second logic state only after new data is available to the selected device and a read cycle is initiated; and returning to the tri-stating step, whereby, when the selected device is deselected and the other of the first and second devices is newly selected, the deselected device is already tri-stated, allowing the newly selected device rapid access to the bus.

20. The method according to claim 19, wherein the tri-stating step tri-states the selected one of the first and second devices upon a rising edge of each clock signal for synchronous devices and upon each assertion of a signal indicative of an address transition detection for asynchronous devices utilizing address transition detection.

* * * * *